(12) United States Patent
Mols et al.

(10) Patent No.: US 10,340,188 B2
(45) Date of Patent: Jul. 2, 2019

(54) METHOD OF TRANSFERRING A SEMICONDUCTOR LAYER

(71) Applicant: IMEC VZW, Leuven (BE)

(72) Inventors: Yves Mols, Wijnegem (BE); Niamh Waldron, Heverlee (BE); Bernadette Kunert, Wilsele (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 15/687,304

(22) Filed: Aug. 25, 2017

(65) Prior Publication Data

US 2018/0061712 A1 Mar. 1, 2018

(30) Foreign Application Priority Data

Aug. 25, 2016 (EP) .................................. 16185708

(51) Int. Cl.
*H01L 21/78* (2006.01)
*H01L 21/8252* (2006.01)
*H01L 21/8258* (2006.01)
*H01L 21/762* (2006.01)
(Continued)

(52) U.S. Cl.
CPC ...... *H01L 21/7813* (2013.01); *H01L 21/6835* (2013.01); *H01L 21/76251* (2013.01); *H01L 21/7806* (2013.01); *H01L 21/8252* (2013.01); *H01L 21/8258* (2013.01); *H01L 21/0254* (2013.01); *H01L 21/02532* (2013.01);
(Continued)

(58) Field of Classification Search
None
See application file for complete search history.

(56) References Cited

U.S. PATENT DOCUMENTS 7,279,369 B2 10/2007 Lei et al.
7,638,842 B2 12/2009 Currie et al.
7,736,996 B2 6/2010 Theodore et al.
(Continued)

FOREIGN PATENT DOCUMENTS

EP 2 924 722 A1 9/2015
JP 2001-102668 A 4/2001

OTHER PUBLICATIONS

Keyvaninia et al. "Ultra-thin DVS-BCB adhesive bonding of III-V wafers, dies and multiple dies to a patterned silicon-on-insulator substrate" *Optical Materials Express*, vol. 3, Issue 1, 2013, pp. 35-46.

(Continued)

*Primary Examiner* — Bradley Smith
(74) *Attorney, Agent, or Firm* — Knobbe, Martens, Olson & Bear LLP

(57) ABSTRACT

The disclosed technology generally relates to manufacturing of semiconductor devices, and more particularly to manufacturing of a semiconductor device by transferring an active layer from a donor substrate. One aspect is a method of manufacturing a semiconductor device includes providing a donor wafer for transferring an active layer, comprising a group IV, a group III-IV or a group II-VI semiconductor material, to a handling wafer. The method includes forming the active layer on a sacrificial layer of the donor wafer, bonding the donor wafer to the handling wafer, and selectively etching the sacrificial layer to remove the donor wafer from the handling wafer, thereby leaving the active layer on the handling wafer.

21 Claims, 7 Drawing Sheets

(51) Int. Cl.
H01L 21/683 (2006.01)
*H01L 21/02* (2006.01)

(52) U.S. Cl.
CPC .. *H01L 21/02543* (2013.01); *H01L 21/02546* (2013.01); *H01L 21/02549* (2013.01)

(56) References Cited

U.S. PATENT DOCUMENTS

| | | |
|---|---|---|
| 8,846,493 B2 | 9/2014 | Libbert et al. |
| 8,963,293 B2 | 2/2015 | Botula et al. |
| 9,000,557 B2 | 4/2015 | Or-Bach et al. |
| 9,159,631 B2 | 10/2015 | Marchena |
| 9,355,889 B2 * | 5/2016 | Waldron ........... H01L 21/76251 |
| 2007/0054465 A1 | 3/2007 | Currie et al. |
| 2012/0280367 A1 | 11/2012 | Logiou |
| 2013/0214284 A1 | 8/2013 | Holder et al. |
| 2013/0292691 A1 | 11/2013 | Henley et al. |
| 2015/0137187 A1 | 5/2015 | Aoki et al. |
| 2015/0162403 A1 | 6/2015 | Oxland |
| 2015/0179664 A1 | 6/2015 | Levander et al. |

OTHER PUBLICATIONS

European Search Report, Application No. 16185708.1, dated Mar. 9, 2017, 7 pages.

* cited by examiner

METHOD OF TRANSFERRING A SEMICONDUCTOR LAYER

CROSS-REFERENCE TO RELATED APPLICATIONS

This application claims foreign priority to European Patent Application No. EP 16185708.1, filed Aug. 25, 2016, the content of which is incorporated by reference herein in its entirety.

BACKGROUND

Field

The disclosed technology generally relates to manufacturing of semiconductor devices, and more particularly to manufacturing of a semiconductor device by transferring an active layer from a donor substrate.

Description of the Related Technology

There is a growing interest in materials other than silicon (Si) as active channel material. Possible candidates for replacing Si are, e.g., germanium (Ge), which is a group IV material, and III-V materials such as, e.g., GaAs, InGaAs or InAs. To be competitive, these should be integrated on a Si platform in order to benefit from the existing Si-based semiconductor processing technologies. The integration of III-V on a Si platform may, however, be challenging due to crystalline defects such as, e.g., lattice mismatch, anti-phase boundaries, mismatch stress relaxation, threading dislocations, etc.

EP 2 924 722 A1 discloses a method for forming such III-V structures on an insulator wafer, wherein a pre-patterned donor wafer is used for transferring channel regions of a group III-V semiconductor material to a Si handling wafer. The group III-V material is provided in fins arranged between shallow trench isolation (STI) regions in a front side of the donor wafer, and is bonded to the handling wafer by means of a bonding oxide layer. The donor wafer is then removed from its back side by, e.g., thinning, leaving channel regions of the group III-V semiconductor material on the handling wafer.

Although different methods for manufacturing semiconductor devices as described above are known, there is a need for alternative and improved methods for providing semiconductor devices having an active layer of a group IV or group III-V material.

SUMMARY OF CERTAIN INVENTIVE ASPECTS

The disclosed technology can provide an improved methodology for manufacturing semiconductor devices, and in particular, to provide a method and a semiconductor wafer for manufacturing a device having an active layer of a group IV material, a group III-V material or a group II-VI material.

This and other objects of the technology disclosed are achieved by means of a method having the features defined in the independent claim. Different implementations of the technology disclosed are defined in the dependent claims.

Hence, according to an aspect a method for manufacturing a semiconductor device is provided. In the method, a donor wafer is provided that comprises a first semiconductor material. On this wafer, a sacrificial layer is formed, which comprises a second semiconductor material forming a pattern of fins that are separated from each other by isolation regions such as e.g. shallow trench isolation, STI, regions. The second semiconductor material may be different from the first semiconductor material. Further, an active layer is formed on the sacrificial layer. The active layer may comprise a group IV semiconductor material, a group III-V semiconductor material or a group II-VI semiconductor material. The active layer is then bonded to a handling wafer, and the donor wafer lifted off from the handling wafer, leaving the active layer bonded to the handling wafer.

The disclosed technology makes use of an understanding that by removing the donor wafer by means of a sacrificial layer, the risk of damaging the active layer may be reduced and the donor wafer reused. The donor wafer may, e.g., be lifted off by means of a selective etching of at least a part of the sacrificial layer or by breaking or splitting the sacrificial layer such that the donor wafer can be broken off from the handling wafer. The advantages of using the sacrificial layer could be compared to prior art technologies such as, e.g., the "smartcut" process, which involves the implantation of hydrogen to a predetermined depth into the donor wafer prior to the step of bonding, and thereafter releasing the donor wafer at the predetermined depth of the hydrogen implantation by means of an anneal process. The present disclosure is also advantageous over the thinning process, wherein the donor wafer is removed from its back side by means of, e.g., grinding. Lifting off the donor wafer by means of the sacrificial layer allows for the donor wafer to be removed without involving any ion-implantation or annealing required, e.g., by the smartcut process, thereby reducing the risk of ion-induced damages and diffusion related damages of the active layer. The present aspects are also advantageous over, e.g., the thinning process, in which the donor wafer is destroyed in a manner that excludes any reuse and the active layer may be damaged by mechanical stress induced by the grinding. The disclosed technology thus allows for a simpler and more cost efficient process for the donor wafer removal, requiring less processing steps and reducing the risk of damaging the active layer.

The handling wafer or substrate may be blanket or patterned, and may, e.g., be chosen from a Si wafer, a Ge wafer, a germanium-on-silicon wafer, a GeOI wafer, or a III-V on insulator wafer such as, e.g., InGaAsOI.

The donor wafer may be a pre-patterned wafer (e.g. using an ART process for manufacturing thereof) onto which the material of the active layer may be grown only on certain areas of the wafer, thereby reducing costs compared to prior art techniques wherein III-V material is provided over the whole wafer. Further, providing the active layer in fin-shaped or confined areas, instead of a coherent wafer-scaled layer, may reduce the risk of cracking and allows for an increased transfer yield.

The III-V material may be integrated on the handling wafer monolithically without the use of expensive and small III-V wafers and/or without the use of expensive and thick strain relaxed buffer (SRB)-based substrate.

According to an embodiment, the step of providing the donor wafer may include a forming of the isolation regions. The isolation regions may be formed in a substrate, such as a blanket Si wafer, comprising the first semiconductor material. The isolating material of the isolation regions may, e.g., comprise an oxide such as $SiO_2$. Further, the fins may be formed between the isolation regions, such that at least a top portion of the fins may comprise the second semiconductor material. Thus, the fins may extend from the donor substrate and be separated by, and in between, the isolation regions.

According to an embodiment, the fins may be formed by recessing at least a portion of the first semiconductor material between the isolation regions. The fins may thus be formed by replacing at least part of the first semiconductor material, either partially (not reaching the depth of the isolation structures) or completely (reaching the full depth of the isolation structures). The removal may be performed by means of etching.

According to an embodiment, the fins may be formed by growing the second semiconductor material, e.g., by epitaxial growth, starting from the first semiconductor material.

The mechanism of replacing the first semiconductor material into the second semiconductor material may also be referred to as aspect ratio trapping (ART) technique, which is advantageous in that may reduce the formation of defects during such a regrowth process.

According to an embodiment, the first semiconductor material may be silicon. It will also be appreciated that the second semiconductor material of the fins may be a group III-V, a group II-VI or a group IV semiconductor material, and that the sacrificial layer may be formed of the same second semiconductor material or a material that is different from the second semiconductor material. The sacrificial layer may be integrally formed with the second semiconductor material of the fins, or be formed of a stack of a plurality of materials.

According to an embodiment, the method may comprise a step of forming a release layer for facilitating the removal of the donor wafer from the handling wafer. The release layer may, e.g., be embedded in the sacrificial layer, or arranged on top of the sacrificial layer (thus forming an intermediate layer between the sacrificial layer and the active layer). In one example, the release layer may be an ion-implanted hydrogen layer of the type used in the smart-cut process.

According to an embodiment, a dielectric layer may be formed on the active layer. Further, the dielectric layer may be planarized (e.g. by chemical mechanical polishing, CMP), preferably down to the active layer which thereby is exposed. The planarization may be performed so as to provide a leveled surface of the active layer. After planarization the dielectric layer may be removed prior to bonding.

According to an embodiment, a bonding layer may be formed on the active layer of the donor wafer. Alternatively, or additionally, the handling wafer may be provided with a similar bonding layer for facilitating the bonding. The choice and presence of a bonding layer may be determined by the particular process used for bonding the donor wafer to the handling wafer. Preferably, the bonding layer is capable of reducing the surface roughness of the surface(s) to be bonded. The bonding layer may, e.g., be a dielectric layer, including, e.g., insulating metal oxides (e.g. $Al_2O_3$, $HfO_2$), insulating dielectrics (e.g. SiO, $SiO_x$, $SiO_2$, SiN), and insulating wide bandgap semiconductors (such as AlN).

According to an embodiment, the donor wafer may be lifted off or removed from the handling wafer in a single piece. This allows for the donor wafer to be reused, e.g., by re-growing the fins between the STI regions, so as to reduce the processing costs. The lift-off may be facilitated by means of a mechanical splitting initiation.

According to an embodiment, the handling wafer (or the donor wafer) may be a flexible wafer or substrate, which, e.g., may be lifted off by means of a break-off process. The flexible wafer may, e.g., be released by being guided over a cylinder surface, or pulled off by an applied force. Examples of such wafers, or substrates, include polyimide materials, polyether ether ketone (PEEK), transparent and conductive polyester materials, and thin sheets of glass. Such substrates may, e.g., be used in connection with flexible electronics or optoelectronics, which, e.g., may be employed in flex circuits, foldable displays and solar panels.

According to some embodiments, the donor wafer and/or the handling wafer may have a wafer size of at least 300 mm.

According to some embodiments, the group III-V semiconductor material(s) may be selected from InP, InGaAs, InAs, GaAs, AlAs, GaSb, AlSb, InSb, GaP, AlP, BAs, BP, BSb, GaN, AN, InN, GaAsSb and ternary and quaternary combinations thereof.

The group IV semiconductor material may be chosen from Ge, SiGe, SnGe or SnSi.

Further objectives, features and advantages of the present invention will appear from the following detailed disclosures as well as from the drawings and the appended claims. Those skilled in the art will realise that different features of the present embodiment can be combined to create embodiments other than those described in the following

BRIEF DESCRIPTION OF THE DRAWINGS

In the following, reference will be made to the appended drawings, on which.

All the figures are schematic, not necessarily to scale, and generally only show parts which are necessary in order to elucidate the invention, wherein other parts may be omitted or merely suggested.

DETAILED DESCRIPTION OF CERTAIN ILLUSTRATIVE EMBODIMENTS

Figure 1:
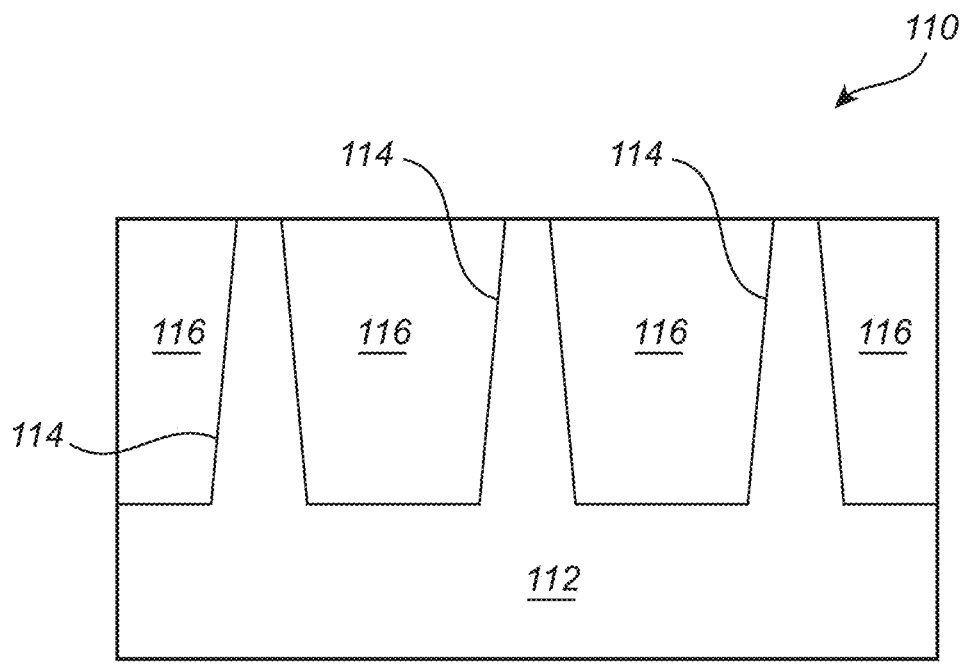
FIG. 1 is a schematic cross section of a donor wafer at a manufacturing stage, according to an embodiment.
Figure 2:
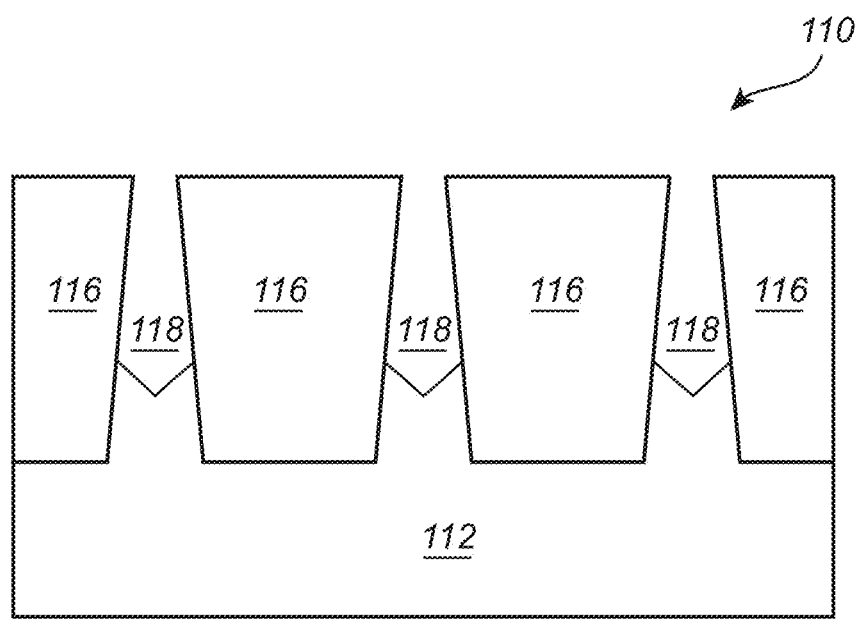
FIG. 2 is a schematic cross section of a donor wafer at a manufacturing stage subsequent to that of FIG. 1, according to an embodiment.
Figure 3:
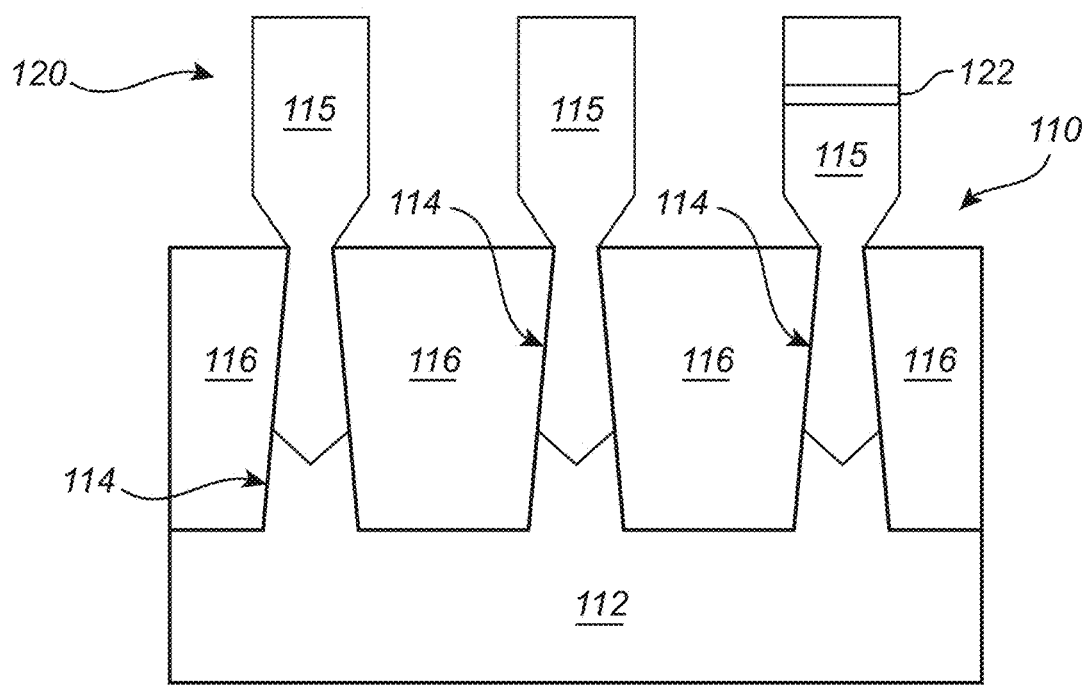
FIG. 3 is a schematic cross section illustrating a donor wafer comprising a sacrificial layer according to an embodiment.

FIGS. 1 to 3 schematically illustrate different process steps of providing a patterned donor wafer 110, according to an embodiment. The donor wafer may be provided by a technique known as aspect ratio trapping (ART), which involves high aspect ratio sub-micron trenches to trap threading dislocations, thereby reducing the dislocation density of lattice mismatched materials grown on silicon.

Referring to FIG. 1, firstly, the donor wafer 110 including a semiconductor substrate 112 may be provided, where the semiconductor substrate includes a first semiconductor material 112 such as, e.g., Si. Isolation regions, such as shallow trench isolation (STI) regions 116 may be formed in the semiconductor substrate 112, thereby defining fins or lines 114 extending between the STI regions 116. The forming of the STI regions 116 may include patterning and etching the substrate 112 to form etched regions including trenches, and filling the etched regions with an insulating material such as, for example $SiO_2$. The fins 114 may have a height corresponding to the height (or depth) of the STI regions 116, such as, e.g., between 100 nm and 500 nm, and a width ranging from 200 nm down to 20 nm or even 5 nm, more preferably ranging from 100 nm down to 20 nm or even 5 nm.

Referring to FIGS. 2 and 3, a sacrificial layer 120 is formed on the donor wafer 110, where a sacrificial layer or a sacrificial structure 120 comprises a second semiconductor material 115 arranged as a pattern of fins 114, where each of the fins 114 is separated from an adjacent one of the fins by one of a plurality of isolation regions 116. As indicated in FIG. 2, the fins 114 may be at least partly etched back, leaving cavities or recesses 118 between the STI regions 116. These recesses 118 may then be re-filled with the second semiconductor material 115 indicated in FIG. 3, thereby forming a sacrificial layer or a sacrificial structure 120. The sacrificial layer or structure 120 comprises a plurality of fins 114.

As illustrated with respect to FIG. 3, at least the upper portions of the fins 114 may be formed of a second semiconductor material 115 forming the sacrificial layer 120. It will however be appreciated that the sacrificial layer 120 (and hence the fin structures 114) may be formed of several layers or materials arranged in, e.g., a stacked structure. The second semiconductor 115 material may include, e.g., a group IV, a group III-V or a group II-VI semiconductor material.

According to some embodiments, the sacrificial layer 120 may comprise a release layer 122 for facilitating the removal of the donor wafer 110 from the handling wafer. The release layer 122 may, e.g., be embedded in the sacrificial layer 120, as indicated in one of the examples given in FIG. 3, or added on top of the sacrificial layer 120. While in the illustrated embodiment, only one of the fins 114 is shown to have the release layer 122 for illustrative purposes, embodiments are not so limited, and in other embodiments, some or all of the fins 114 may have the release layer 122.

Figure 4:
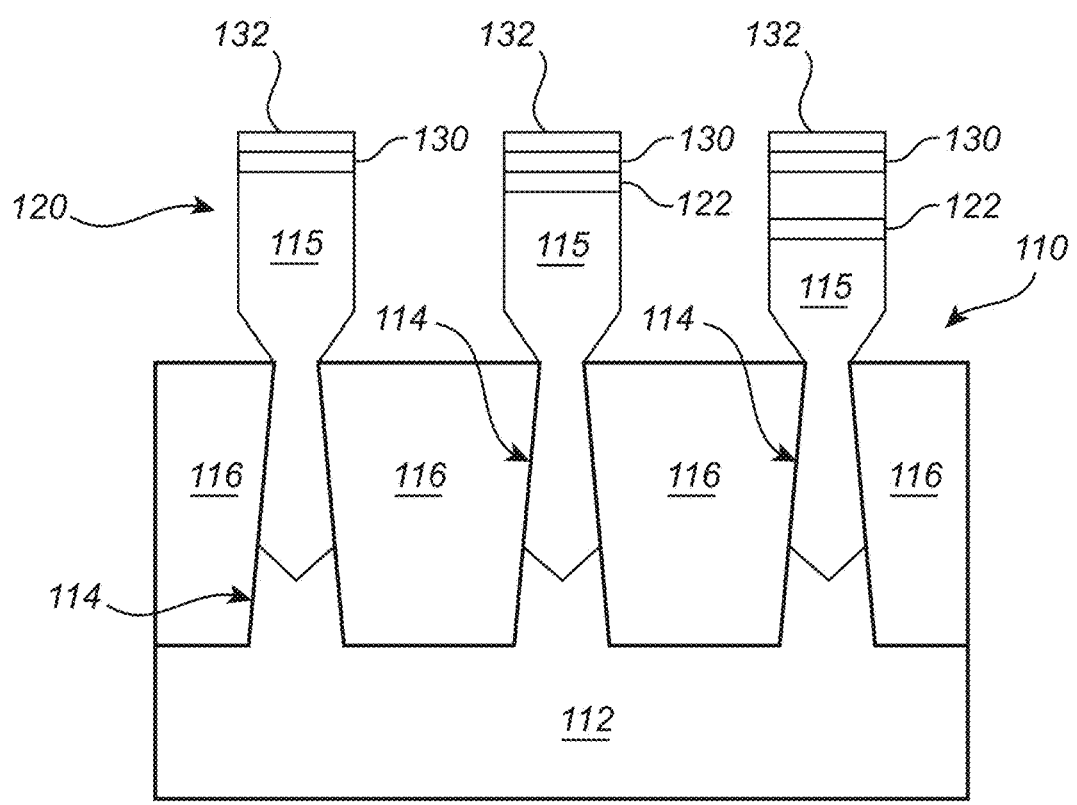
FIG. 4 is a schematic cross section of the donor wafer of FIG. 3, further comprising an active layer and a bonding layer.

FIG. 4 illustrates forming an active layer 130 on the sacrificial layer 120. In the illustrated embodiment, the donor wafer 110 has an active layer 130 and a bonding layer 132 that are formed on the sacrificial layer 120. The active layer 130 may, e.g., be provided by epitaxial growth, e.g., selective epitaxial growth, and may comprise a group III-V, a group IV or a group II-VI semiconductor material serving as the active regions or channel regions of the final semiconductor device. While in the illustrated embodiment, different regions of the sacrificial layer 120 or different ones of the fins 114 are formed of the same second semiconductor material 115, embodiments are not so limited. In other embodiments, different regions of the sacrificial layer 120 or different ones of the fins 114 may be provided with different types of active layer 130 materials. In one example, the different regions may correspond to different fins 114 of the donor substrate 112. Some of the regions may then be provided with, e.g., an InP layer, whereas other regions may be provided with a Ge layer. Such co-integration of different semiconductor materials allows for the InP regions to be used for an NMOS device and the Ge regions to be used for a PMOS device.

As indicated in FIG. 4, the donor wafer 110 may further be provided with a release layer 122. The release layer 122 may, e.g., be arranged between the sacrificial layer 120 and the active layer 122 (as illustrated in the middle structure of the sacrificial layer in FIG. 4), or embedded in the sacrificial layer 120 (as indicated in the rightmost structure of the sacrificial layer in FIG. 4). While the illustrated donor wafer 110 shows fins having the release layers 122 formed at different locations, embodiments are not so limited. In some embodiments, no fins have the release layers. In some other embodiments, all fins have the release layers 122 formed immediately below the active layers 130. In yet some other embodiments, all fins have embedded release layers 122.

Figure 5:
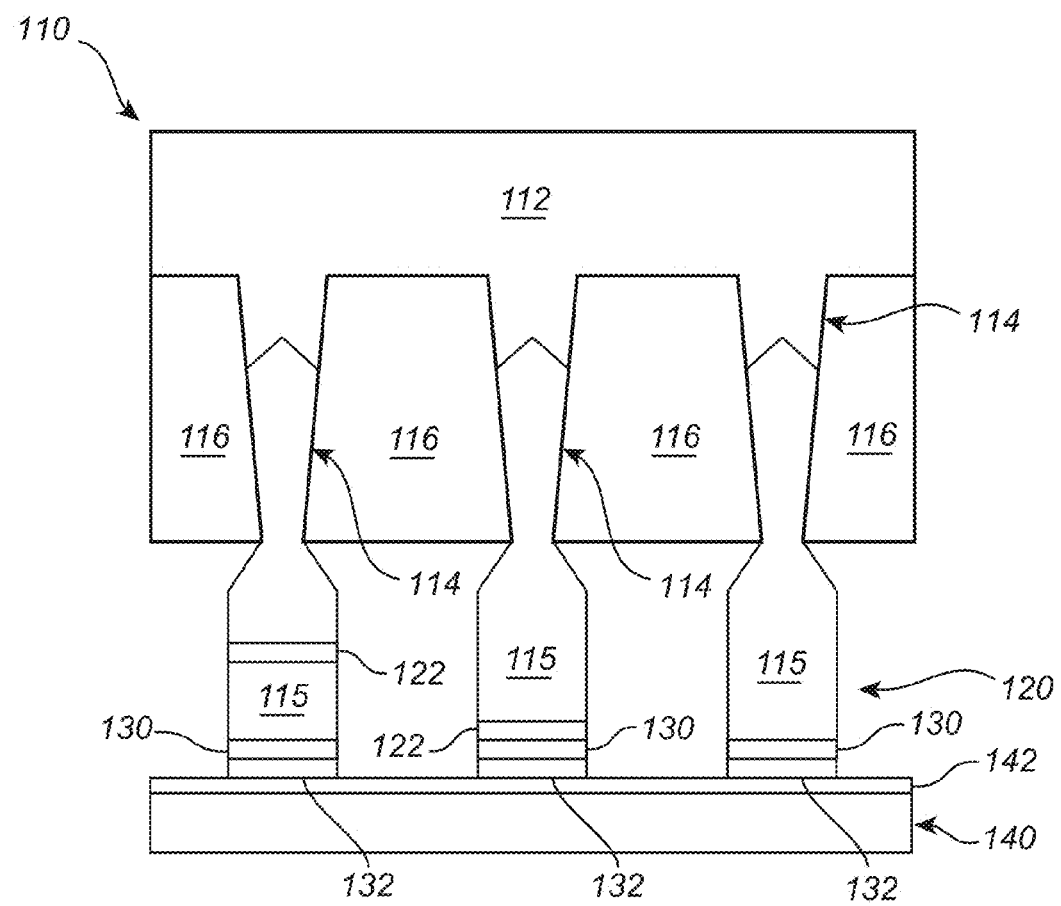
FIG. 5 schematically illustrates a donor wafer that has been bonded to a handling wafer according to an embodiment.

The bonding layer 132 may be formed on the active layer 130 so as to facilitate the subsequent bonding to the handling layer. The bonding layer 132 may be a dielectric layer including, e.g., an insulating metal oxide (e.g., $Al_2O_3$, $HfO_2$), an insulating dielectric (e.g. SiO, SiN), an insulating wide bandgap semiconductor (e.g., AN) or other another suitable material that may form a chemical bond with another bonding layer, e.g., a bonding layer 142 formed on a handling wafer 140 (FIG. 5). The bonding layer 132 may in one example be an $Al_2O_3$, SiOx The bonding layer 132 may form the chemical bonds upon, e.g., application of temperature and/or pressure greater than ambient temperature and/or pressure. The bonding layer 132 may be deposited by, e.g., chemical vapour deposition (CVD) or atomic layer deposition (ALD) or another suitable process that can produce a bondable layer.

FIG. 5 illustrates bonding the active layer 130 to a handling wafer 140. In the illustrated embodiment, the donor wafer 110, shown as being turned upside down, is bonded to the handling wafer 140. The handling wafer may be a Si based substrate, such as a blanket Si wafer or a previously patterned Si wafer with Si active and/or Ge, SiGe active regions or, e.g., a Ge-on-Si (patterned or blanket) wafer, or a Ge—OI on Si (patterned or blanket) wafer.

The handling wafer 140 and the donor wafer 110 may be bonded to each other by contacting the bonding layer 132 of the donor wafer 110 to the handling wafer 140, or, if present, to a corresponding bonding layer 142 of the handling wafer 140. The bonding layer 142 may be formed of the same material or a different material compared to the bonding layer 132 formed on the fins 114 (FIG. 4).

Figure 6:
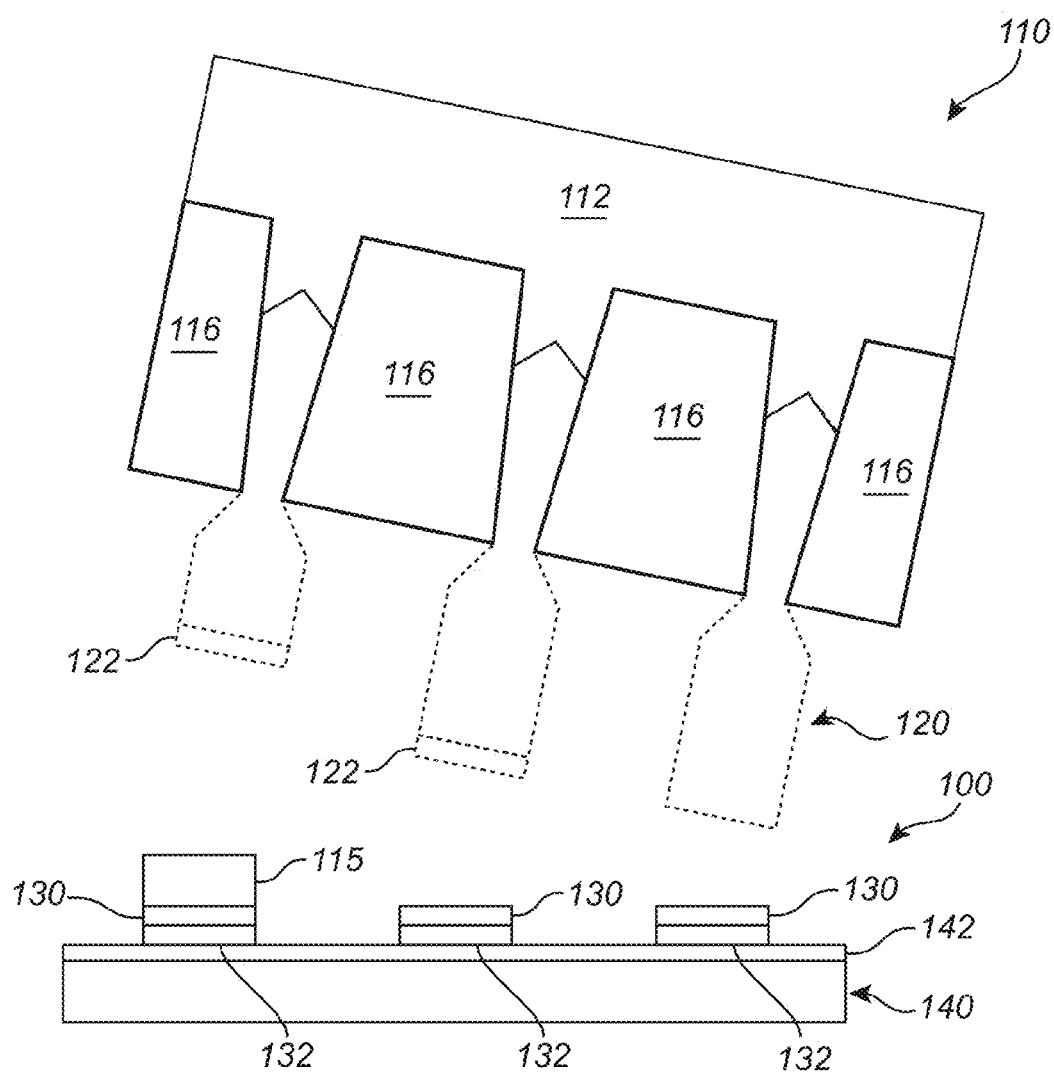
FIG. 6 illustrates the lift-off process of the donor wafer according to an embodiment.

As indicated in FIG. 6, the donor wafer 110 may be removed from the handling wafer 140 in a lift-off process leaving the active layer 130 on the handling wafer 140. The lift-off may be performed by selectively etching at least part of the sacrificial layer 120, e.g., in a dry etch process, until the donor wafer 110 can be released from the handling wafer 140. The sacrificial layer 120 may be etched in a manner that allows for the donor wafer 140 to be reused in the processing of subsequent semiconductor devices. During the lift-off the sacrificial layer 120 may be removed completely such that the recesses 118 are exposed (cf. FIG. 2). Alternatively, the lift-off process may leave at least some of the second material 115 between the fins 116 of the donor substrate 112. Other lift-off processes are however conceivable, e.g., including breaking off the donor wafer 110 from the handling wafer 140, preferable at the narrowest portion of the sacrificial layer (as indicated in, e.g., FIG. 6). Further examples may include etching a release layer (not shown in FIG. 6) that may be formed in the sacrificial 120 layer or between the sacrificial layer 120 and the active layer 130. In case the release layer is embedded in the sacrificial layer 120, the lift-off may leave at least some of the material of the sacrificial layer on the active layer (as indicated in the leftmost example of the active layer in FIG. 6). The remaining material of the sacrificial layer 120 may be removed in a subsequent etching or planarization process.

Figure 7:
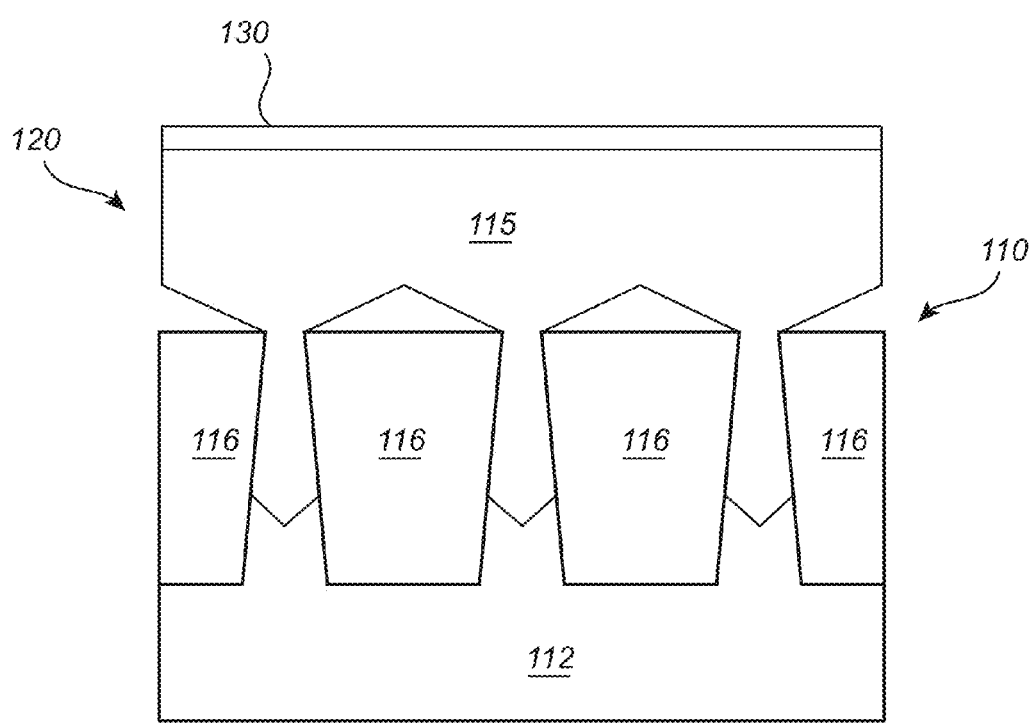
FIG. 7 is a schematic cross section of a donor wafer wherein the sacrificial layer is merged into a substantially continuous layer.

FIG. 7 illustrates a donor wafer 110 according to an embodiment that may be similarly configured as the embodiment described with reference to FIG. 4, except for the configuration of the sacrificial layer 120. As indicated in the figure, the sacrificial layer 120 may be grown out of the trenches between the isolation regions 116 such that the fin structure is closed or merged into a substantially continuous layer covering the underlying isolation regions 116. This advantageously allows for a substantially continuous, or non-patterned, active layer 130 to be formed on the sacrificial layer 120.

The type of sacrificial layer 120 discussed in connection with the above embodiments may be selected based on the type of active layer 130 to be transferred to the handling wafer 140. Some conceivable examples, allowing for a selective etching of the sacrificial layer 120, are listed below:

sacrificial layer: InP, active layer: GaInAs;
sacrificial layer: InP, active layer: GaSbAs;
sacrificial layer: GaInAs, active layer: InP;
sacrificial layer: GaInAs, active layer: GeSn;
sacrificial layer: InAs, active layer: GaSb;
sacrificial layer: GaSb, active layer: InAs;
sacrificial layer: GaAs, active layer: Ge;
sacrificial layer: Ga, active layer: GaAs;
sacrificial layer: GeSi, active layer: GaPAs;
sacrificial layer: BGaP, active layer: Si;
sacrificial layer: GaPN, active layer: Si;
sacrificial layer: GaAsP, active layer: SiGe.

It will however be appreciated the term 'active material' may relate to other materials than channel materials, such as, e.g., materials for laser applications, detectors, modulators etcetera. Further, the active layer may be strained so as to achieve a desired materials characteristic. The strain may be defined by the specific combination of active material and sacrificial layer.

As described herein, the sacrificial layer may be selectively removed or etched relative to one or more of the active layer 130, the semiconductor substrate 112, STI 116, the handling wafer 140 and the bonding layers 142, 130. In various examples, the etch selectivity may be greater than 5:1, greater than 10:1, greater than 20:1, greater than 50:1, greater than 100:1, greater than 200:1, or in a range defined by any of these values, depending the etch chemistry and the choice of materials. Examples of selective etching may include the following processes:

InGaAs or InAlAs selectively removed from InP by means of $H_2SO_4:H_2O_2:H_2O$ or $H_3PO_4:H_2O_2:H_2O$ in a wet or vapour etching process.

InAs selectively removed from InP by means of $HF:H_2O$ or $HNO_3:H_2O_2$

GaSb may be selectively removed from InP by means of CH3COOH:HNO3:HF followed by $HCl:HNO_3:H_2O_2$ GaSb selectively removed from InAs by means of $HF:H_2O_2:H_2O$, wherein InAs may act as a stop layer GaAs selectively removed from Ge by means of $H_2SO_4:H_2O_2:H_2O$, or by $XeF_2$ in a dry etching process GaP selectively removed from Si by means of aqua regia, 1:1 or 3:1 ($HCl:HNO_3$) or 1:1:1 ($HCl:HNO_3:CH_3COOH$).

Figure 8:
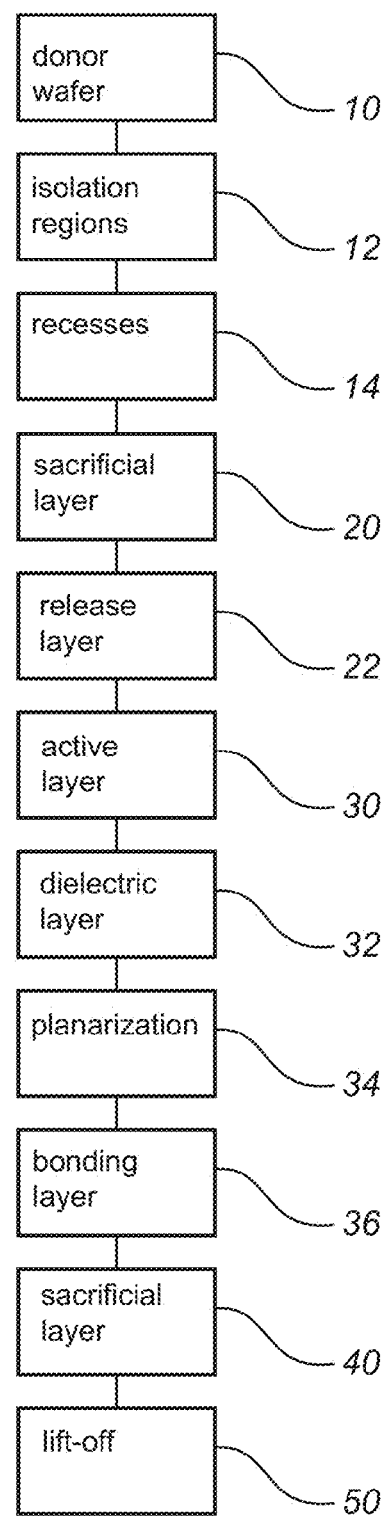
FIG. 8 is a schematic illustration of a method according to an embodiment.

With reference to FIG. 8 there is illustrated a schematic outline of a method for manufacturing a semiconductor device according to an embodiment. The method comprises the steps of providing 10 a donor wafer by forming 12 isolation regions in a donor substrate, and forming fins between the STI regions by recessing 14 at least a portion of the first semiconductor material between the STI regions and forming 20 a sacrificial layer of a second semiconductor material on the donor wafer wherein the forming may include a step of forming 22 a release layer that may be embedded in the sacrificial layer. The method also includes a step of forming 30 an active layer on the sacrificial layer, including a planarization process wherein a dielectric layer may be formed 32 on the active layer and planarized 34 prior to the forming 36 of the bonding layer. After the bonding step 40, the donor wafer is removed from the handling wafer by means of, e.g., a lift-off step 50, wherein the sacrificial layer may be selectively etched or broken such that the active layer is transferred to the handling wafer.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing a semiconductor device, the method comprising:
providing a donor wafer formed of a first semiconductor material;
forming a sacrificial layer on the donor wafer, the sacrificial layer formed of a second semiconductor material forming a pattern of fins, wherein each one of the fins is separated from an adjacent one of the fins by one of a plurality of isolation regions;
forming an active layer on the sacrificial layer, the active layer comprising a group IV semiconductor material or a group III-V semiconductor material or a group II-VI semiconductor material;
bonding the active layer to a handling wafer;
lifting off the donor wafer from the handling wafer such that the active layer is left on the handling wafer; and
configuring the donor wafer to be reused by removing the sacrificial layer and forming a new sacrificial layer between the isolation regions.

2. The method according to claim 1, wherein providing the donor wafer comprises:
forming the isolation regions in a donor substrate comprising the first semiconductor material; and
forming the fins, wherein each of the fins is formed between adjacent isolation regions, wherein at least a top portion of the each of the fins comprises the second semiconductor material.

3. The method according to claim 1, wherein the sacrificial layer comprises a group III-V semiconductor material, a group II-VI semiconductor material or a group IV semiconductor material, wherein the sacrificial layer is formed of a material different from the material of the active layer.

4. The method according to claim 1, wherein the first semiconductor material is silicon and/or the second semiconductor material is a group III-V semiconductor material, a group II-VI semiconductor material or a group IV semiconductor material.

5. The method according to claim 1, further comprising:
forming a release layer on the sacrificial layer, wherein lifting off the donor wafer comprises selectively etching the release layer.

6. The method according to claim 1, wherein forming the sacrificial layer further comprises:

forming a release layer that is embedded in the sacrificial layer;
lifting off the donor wafer by selectively etching the release layer; and
selectively removing remaining portions of the sacrificial layer from the active layer.

7. The method according to claim 1, further comprising, before bonding the active layer to the handling wafer:
forming a dielectric layer on the active layer; and
planarizing the dielectric layer.

8. The method according to claim 1, wherein bonding the active layer further comprises:
forming a bonding layer on the active layer,
wherein the active layer is bonded to the handling wafer by the bonding layer.

9. The method according to claim 1, wherein the active layer is bonded by a bonding layer formed on the handling wafer.

10. The method according to claim 1, wherein the donor wafer is lifted off from the handling wafer by selectively etching at least a part of the sacrificial layer.

11. The method according to claim 1, wherein the donor wafer is lifted off from the handling wafer by breaking off the donor wafer from the handling wafer.

12. The method according to claim 1, wherein the donor wafer is lifted off in a single piece.

13. The method according to claim 1, wherein the handling wafer is a flexible wafer.

14. The method according to claim 1, wherein:
the sacrificial layer comprises InP and the active layer comprises GaInAs; or
the sacrificial layer comprises InP and the active layer comprises GaSbAs; or
the sacrificial layer comprises GaInAs and the active layer comprises InP; or
the sacrificial layer comprises GaInAs and the active layer comprises GeSn; or
the sacrificial layer comprises InAs and the active layer comprises GaSb; or
the sacrificial layer comprises GaSb and the active layer comprises InAs; or
the sacrificial layer comprises GaAs and the active layer comprises Ge; or
the sacrificial layer comprises Ga and the active layer comprises GaAs; or
the sacrificial layer comprises GeSi and the active layer comprises GaPAs; or
the sacrificial layer comprises BGaP and the active layer comprises Si; or
the sacrificial layer comprises GaPN and the active layer comprises Si; or
the sacrificial layer comprises GaAsP and the active layer comprises SiGe.

15. A method of fabricating a semiconductor device, comprising:
providing a donor wafer comprising a first substrate having formed thereon a plurality of fins protruding in a vertical direction, wherein at least an upper portion of each of the fins is formed of a sacrificial semiconductor material;
forming an active semiconductor layer on the upper portion of each of the fins, such that the at the upper portion of each of the fins is vertically interposed between the active semiconductor layer and the substrate;
transferring the active semiconductor layer to a second substrate,
wherein transferring comprises attaching the active semiconductor layer to the second substrate and removing the sacrificial semiconductor material selectively against the active semiconductor layer and against the substrate; and
configuring the donor wafer to be reused by removing the sacrificial layer and forming a new sacrificial layer between the isolation regions.

16. The method of claim 15, wherein attaching the active semiconductor layer comprises attaching through one or more bonding dielectric layers between the active semiconductor layer and the second substrate.

17. The method of claim 16, wherein the sacrificial semiconductor material and the active semiconductor layer may be selected, respectively, from a combination of materials selected from the group consisting of InP and GaInAs, InP and GaSbAs, GaInAs and InP, GaInAs and GeSn, InAs and GaSb, GaSb and InAs, GaAs and Ge, Ga and GaAs, GeSi and GaPAs, BGaP and Si, GaPN and Si and GaAsP and SiGe.

18. The method of claim 17, wherein forming the active semiconductor layer on each of the fins comprises forming one or both of an InP layer to serve as a channel layer for a PMOS device and a Ge layer to serve as a channel layer for an NMOS device.

19. The method of claim 18, wherein removing the sacrificial semiconductor material comprises selectively removing one or both of GaInAs selectively against InP in $H_2SO_4:H_2O_2:H_2O$ or $H_3PO_4:H_2O_2:H_2O$ and GaAs selectively against Ge in $H_2SO_4:H_2O_2:H_2O$ or $XeF_2$.

20. A method of fabricating a semiconductor device, comprising:
providing a donor wafer comprising a first substrate having formed thereon a plurality of fins protruding in a vertical direction, wherein at least an upper portion of each of the fins is formed of a sacrificial semiconductor material;
forming an active semiconductor layer on the upper portion of each of the fins, such that the at the upper portion of each of the fins is vertically interposed between the active semiconductor layer and the substrate;
transferring the active semiconductor layer to a second substrate,
wherein transferring comprises attaching the active semiconductor layer to the second substrate and removing the sacrificial semiconductor material selectively against the active semiconductor layer and against the substrate,
wherein attaching the active semiconductor layer comprises attaching through one or more bonding dielectric layers between the active semiconductor layer and the second substrate,
wherein the sacrificial semiconductor material and the active semiconductor layer may be selected, respectively, from a combination of materials selected from the group consisting of InP and GaInAs, InP and GaSbAs, GaInAs and InP, GaInAs and GeSn, InAs and GaSb, GaSb and InAs, GaAs and Ge, Ga and GaAs, GeSi and GaPAs, BGaP and Si, GaPN and Si and GaAsP and SiGe, and
wherein forming the active semiconductor layer on each of the fins comprises forming one or both of an InP layer to serve as a channel layer for a PMOS device and a Ge layer to serve as a channel layer for an NMOS device.

21. The method of claim 20, wherein removing the sacrificial semiconductor material comprises selectively removing one or both of GaInAs selectively against InP in $H_2SO_4:H_2O_2:H_2O$ or $H_3PO_4:H_2O_2:H_2O$ and GaAs selectively against Ge in $H_2SO_4:H_2O_2:H_2O$ or $XeF_2$.

* * * * *

UNITED STATES PATENT AND TRADEMARK OFFICE
CERTIFICATE OF CORRECTION

PATENT NO. : 10,340,188 B2
APPLICATION NO. : 15/687304
DATED : July 2, 2019
INVENTOR(S) : Yves Mols et al.

It is certified that error appears in the above-identified patent and that said Letters Patent is hereby corrected as shown below:

In the Specification

In Column 4, Line 8, delete "AN," and insert --AlN,--.

In Column 4, Line 17, after "following" insert --.--.

In Column 6, Line 13, delete "AN)" and insert --AlN)--.

In Column 6, Line 17, delete "SiOx" and insert --SiOx.--.

In Column 7, Line 48, after "$H_2O_2$" insert --.--.

In Column 7, Line 50, after "$H_2O_2$" insert --.--.

In Column 7, Line 52, after "layer" insert --.--.

In Column 7, Line 54, after "process" insert --.--.

In the Claims

In Column 9, Line 62, delete "at the".

In Column 10, Line 40, delete "at the".

Signed and Sealed this
Thirty-first Day of December, 2019

Andrei Iancu
*Director of the United States Patent and Trademark Office*